US009425083B2

(12) United States Patent
Miyazawa et al.

(10) Patent No.: US 9,425,083 B2
(45) Date of Patent: Aug. 23, 2016

(54) HANDLE SUBSTRATE, COMPOSITE SUBSTRATE FOR SEMICONDUCTOR, AND SEMICONDUCTOR CIRCUIT BOARD AND METHOD FOR MANUFACTURING THE SAME

(71) Applicant: NGK INSULATORS, LTD., Aichi-prefecture (JP)

(72) Inventors: Sugio Miyazawa, Kasugai (JP); Yasunori Iwasaki, Kitanagoya (JP); Tatsuro Takagaki, Nagoya (JP); Akiyoshi Ide, Kasugai (JP); Hirokazu Nakanishi, Nagoya (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 0 days.

(21) Appl. No.: 14/853,011

(22) Filed: Sep. 14, 2015

(65) Prior Publication Data
US 2016/0005643 A1    Jan. 7, 2016

Related U.S. Application Data

(63) Continuation of application No. PCT/JP2014/083209, filed on Dec. 16, 2014.

(30) Foreign Application Priority Data

Dec. 25, 2013  (JP) ................................ 2013-267455

(51) Int. Cl.
*H01L 21/683* (2006.01)
*H01L 23/15* (2006.01)
(Continued)

(52) U.S. Cl.
CPC ........... *H01L 21/76254* (2013.01); *C01F 7/02* (2013.01); *C04B 35/10* (2013.01);
(Continued)

(58) Field of Classification Search
CPC ..................................................... C04B 35/115
See application file for complete search history.

(56) References Cited

U.S. PATENT DOCUMENTS 5,382,556 A * 1/1995 Takahashi ............. C04B 35/115
                                                    501/105
6,090,648 A    7/2000 Reedy et al.
(Continued)

FOREIGN PATENT DOCUMENTS

JP    5-160240 A    6/1993
JP    8-512432 A    12/1996
(Continued)

OTHER PUBLICATIONS

International Search Report and Written Opinion for PCT Patent App. No. PCT/JP2014/083209 (Mar. 31, 2015) with English translations of the Search Report and relevant portions of the Opinion.
(Continued)

*Primary Examiner* — Stephen W Smoot
(74) *Attorney, Agent, or Firm* — Cermak Nakajima & McGowan LLP; Tomoko Nakajima

(57) ABSTRACT

It is provided a handle substrate of a composite substrate for a semiconductor. The handle substrate is composed of a translucent polycrystalline alumina. A purity of alumina of the translucent polycrystalline alumina is 99.9% or higher, an average of a total forward light transmittance of the translucent polycrystalline alumina is 60% or higher in a wavelength range of 200 to 400 nm, and an average of a linear light transmittance of the translucent polycrystalline alumina is 15% or lower in a wavelength range of 200 to 400 nm.

7 Claims, 6 Drawing Sheets

(51) Int. Cl.
*H01L 21/762* (2006.01)
*H01L 27/12* (2006.01)
*C04B 35/10* (2006.01)
*C01F 7/02* (2006.01)
*H01L 21/02* (2006.01)
*H01L 29/06* (2006.01)

(52) U.S. Cl.
CPC ..... *H01L21/02002* (2013.01); *H01L 21/6835* (2013.01); *H01L 23/15* (2013.01); *H01L 27/12* (2013.01); *H01L 29/06* (2013.01); *C01P 2006/60* (2013.01); *H01L 2221/68327* (2013.01); *H01L 2221/68377* (2013.01); *H01L 2221/68381* (2013.01)

(56) References Cited

U.S. PATENT DOCUMENTS

| | | | |
|---|---|---|---|
| 6,306,788 B1 * | 10/2001 | Watanabe | C04B 35/115 264/674 |
| 6,908,828 B2 | 6/2005 | Letertre et al. | |
| 7,268,061 B2 | 9/2007 | Miyanari et al. | |
| 8,088,670 B2 | 1/2012 | Akiyama et al. | |
| 8,975,159 B2 | 3/2015 | Akiyama | |
| 8,981,531 B2 | 3/2015 | Iwasaki et al. | |
| 2003/0125189 A1 * | 7/2003 | Castro | A61K 6/0255 501/127 |
| 2007/0077685 A1 | 4/2007 | Noda et al. | |
| 2014/0191373 A1 * | 7/2014 | Iwasaki | H01L 21/76251 257/618 |
| 2015/0102707 A1 | 4/2015 | Hori et al. | |
| 2015/0232389 A1 * | 8/2015 | Iwasaki | C04B 35/44 257/506 |
| 2015/0357221 A1 * | 12/2015 | Takagaki | H01L 21/683 428/192 |
| 2015/0376066 A1 * | 12/2015 | Miyazawa | H01L 21/7624 428/148 |
| 2016/0046528 A1 * | 2/2016 | Miyazawa | C04B 35/115 428/141 |

FOREIGN PATENT DOCUMENTS

| | | |
|---|---|---|
| JP | 2003-224042 A | 8/2003 |
| JP | 2005-159155 A | 6/2005 |
| JP | 2005-191550 A | 7/2005 |
| JP | 2008-288556 A | 11/2008 |
| JP | 2010-258341 A | 11/2010 |
| JP | 2010-278341 A | 12/2010 |
| WO | WO2010/128666 A1 | 11/2010 |
| WO | WO2013/187410 A1 | 12/2013 |
| WO | WO2014/013980 A1 | 1/2014 |

OTHER PUBLICATIONS

English translation of the Written Opinion for PCT Patent App. No. PCT/JP2014/083209 (Jan. 7, 2015).

* cited by examiner

HANDLE SUBSTRATE, COMPOSITE SUBSTRATE FOR SEMICONDUCTOR, AND SEMICONDUCTOR CIRCUIT BOARD AND METHOD FOR MANUFACTURING THE SAME

TECHNICAL FIELD

The present invention relates to a handle substrate, a composite substrate for a semiconductor, a semiconductor circuit board, and a method for manufacturing the same.

BACKGROUND ARTS

According to prior arts, it has been known to obtain SOI including a handle substrate composed of a transparent and insulating substrate and called Silicon on Quartz (SOQ), Silicon on Glass (SOG) and Silicon on Sapphire (SOS). It has been also known an adhered wafer obtained by bonding a transparent wide-gap semiconductor, including GaN, ZnO, diamond, AlN or the like, to a donor substrate such as silicon. The SOQ, SOG, SOS, etc., are expected to be applied to projectors, high-frequency devices and the like due to insulation and transparency of the handle substrate. Further, a bonded wafer that has a composite structure of a thin film made of the wide-gap semiconductor and the handle substrate is also expected to be applied to high-performance lasers, power devices and the like.

Such a composite substrate for semiconductors is comprised of the handle substrate and the donor substrate. In general, each of the handle substrate and the donor substrate is made up of a monocrystalline material. In the related art, a main method for forming these substrates involves forming a silicon layer on a base substrate by epitaxial growth. On the other hand, in recent years, the method of directly bonding them has been developed to contribute to improving the performance of semiconductor devices (see Patent Documents 1, 2, and 3). That is, such handle substrate and donor substrate are bonded together directly or via a bonding layer or an adhesive layer.

However, since sapphire is expensive, a substrate made of a material other than sapphire is desired to be used as the handle substrate in order to reduce the cost. With the progress in the bonding techniques described above, there are proposed various handle substrates that are made of a material other than sapphire, such as quartz, a glass, or alumina (see Patent Documents 4, 5, 6, and 7).

This kind of semiconductor device is essentially required to reduce its height together with increasing functionality and reduction of the size of an apparatus onto which the semiconductor device is to be mounted. The semiconductor device is thinned by processing, such as grinding, polishing, and etching, of one main surface (opposed surface) of the composite substrate formed by bonding, opposite to the other main surface thereof (main surface of the circuit side) with the semiconductor device formed therein. However, if the composite substrate is thinned, the warping of the substrate is more likely to occur, making it difficult to handle the substrate. For this reason, a method for enabling the handling of the composite substrate is known, which involves bonding a separate supporting body to the main surface on the circuit side of the composite substrate (see Patent Document 8).

CITATION LIST

Patent Document

Patent document 1: Japanese Unexamined Patent Application Publication No. H08(1996)-512432A
Patent document 2: Japanese Unexamined Patent Application Publication No. 2003-224042A
Patent document 3: Japanese Unexamined Patent Application Publication No. 2010-278341A
Patent Document 4: WO2010/128666 A1
Patent document 5: Japanese Unexamined Patent Application Publication No. H05(1993)-160240A
Patent document 6: Japanese Unexamined Patent Application Publication No. H05(1993)-160240A
Patent document 7: Japanese Unexamined Patent Application Publication No. 2008-288556A
Patent document 8: Japanese Unexamined Patent Application Publication No. 2005-191550A
Patent document 9: PCT/JP2013/069284 (WO 2014-013980 A1)
Patent document 10: Japanese Unexamined Patent Application Publication No. 2010-258341A

SUMMARY OF THE INVENTION

To bond a separate supporting body to the main surface of the composite substrate on the circuit side, while considering the ease of removing the composite substrate from the supporting body later, some adhesives are proposed that are characterized by the loss of the adhesion properties by curing with ultraviolet rays, by the loss of the adhesion properties by thermal curing, or by being dissoluble in a specific solvent. However, when taking into consideration the damage to the device due to the heat or solvent, an ultraviolet curable adhesive is desirable, as it can remove the supporting body without any damage that would otherwise be caused by heat or solvent.

Ultraviolet rays are applied to an ultraviolet curable resin while the ultraviolet curable resin is placed to intervene between the composite substrate and the separate supporting body. In this case, the ultraviolet rays should be applied from the supporting body side or alternatively from the composite substrate side.

However, when applying the ultraviolet rays from the supporting body side, the material for the supporting body has to be one that allows the ultraviolet rays to pass through it. The supporting body essentially needs to have adequate properties, including mechanical strength, resistance to chemicals, and thermal expansion matching with a substrate to which the supporting body is bonded, depending on a backside process after bonding. If the supporting body is further required to have the adequate transmission properties of ultraviolet rays, selection options for the materials of the supporting body are limited, which is not preferable in terms of productivity. From this aspect, the ultraviolet rays are preferably applied from the composite substrate side.

However, as can be seen from the studies by the inventors, the supporting body is bonded to the composite substrate with the ultraviolet curable resin, and the resin is cured by irradiating the composite substrate with the ultraviolet rays from the handle substrate side. In this case, a crack or failure of removal occurs in the composite substrate in removing the composite substrate from the supporting body in the following steps, resulting in reduced yield.

An object of the present invention is to prevent the occurrence of cracks or failures of removal in the composite substrate, when the ultraviolet curable resin is cured by irradiating the composite substrate with the ultraviolet rays from the handle substrate side, followed by removing the composite substrate from the supporting body.

The present invention provides a handle substrate of a composite substrate for a semiconductor. The handle substrate is composed of a translucent polycrystalline alumina. An alumina purity of the translucent polycrystalline alumina is 99.9% or higher. An average of a total forward light transmittance of the translucent polycrystalline alumina is 60% or higher in a wavelength range of 200 to 400 nm, and an average of a linear light transmittance of the translucent polycrystalline alumina is 15% or lower in a wavelength range of 200 to 400 nm.

Further, the present invention is directed to a composite substrate for a semiconductor, which includes the handle substrate, and a donor substrate bonded to a bonding surface of the handle substrate.

Moreover, the present invention is directed to a semiconductor circuit board that includes the composite substrate for a semiconductor, and a circuit provided on the donor substrate.

The present invention further provides a method for manufacturing a semiconductor circuit board. The semiconductor circuit board includes a handle substrate, a donor substrate bonded to a bonding surface of the handle substrate, and a circuit provided on the donor substrate. The method includes the steps of:

preparing a component that includes a base substrate comprised of a translucent polycrystalline alumina and having a bonding surface and an opposed surface, a donor substrate bonded to the bonding surface of the base substrate, and a circuit provided on the donor substrate. An alumina purity of the translucent polycrystalline alumina is 99.9% or higher. An average of a total forward light transmittance of the translucent polycrystalline alumina is 60% or higher in a wavelength range of 200 to 400 nm, and an average of a linear light transmittance of the translucent polycrystalline alumina is 15% or lower in the wavelength range of 200 to 400 nm. The method also includes the steps of:

forming a handle substrate by processing the base substrate from a side of the opposed surface to thereby decrease a thickness of the base substrate; and irradiating ultraviolet rays in a wavelength range of 200 to 400 nm to an ultraviolet curable resin from the handle substrate side, thereby curing the ultraviolet curable resin, while the ultraviolet curable adhesive is placed to intervene between the donor substrate and a supporting body.

Accordingly, the present invention can suppress the occurrence of cracks or failures of removal in the composite substrate, when the ultraviolet curable resin is cured by irradiating the composite substrate with the ultraviolet rays from the handle substrate side, followed by removing the composite substrate from the supporting body.

MODES FOR CARRYING OUT THE INVENTION

The present invention will be described in more detail below, with reference to the accompanying drawings as appropriate.

Figure 1A:
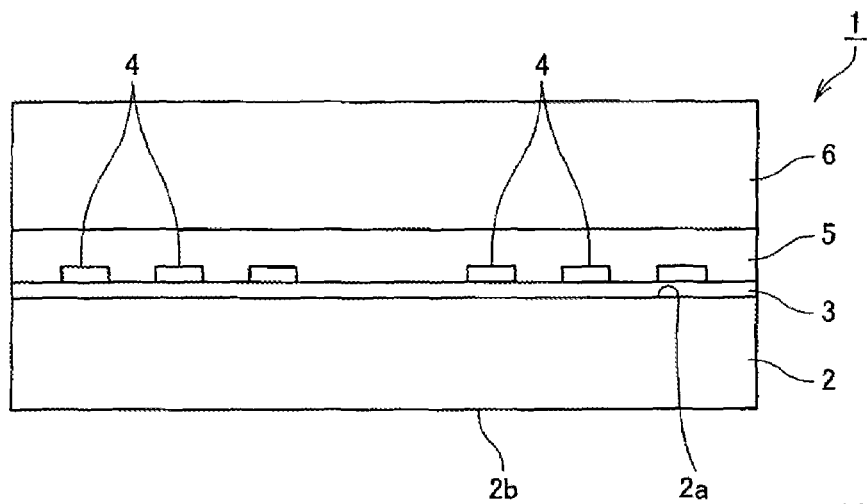
FIG. 1(a) is a schematic diagram showing a component 1 that includes a base substrate 2 for a handle substrate, a donor substrate 3, an ultraviolet curable resin 5 and a supporting body 6.

As shown in FIG. 1(a), a base substrate 2 made of translucent polycrystalline alumina is provided. One of a pair of main surfaces of the base substrate 2 is a bonding surface 2a, and the other is an opposed surface 2b. A donor substrate 3 is bonded to the bonding surface 2a of the base substrate 2, and a circuit 4 is formed over the donor substrate 3. Then, an ultraviolet curable resin 5 is placed to intervene between the donor substrate 3 and a separate supporting body 6, whereby the donor substrate and the supporting body are stuck together to fabricate a component 1.

Figure 1B:
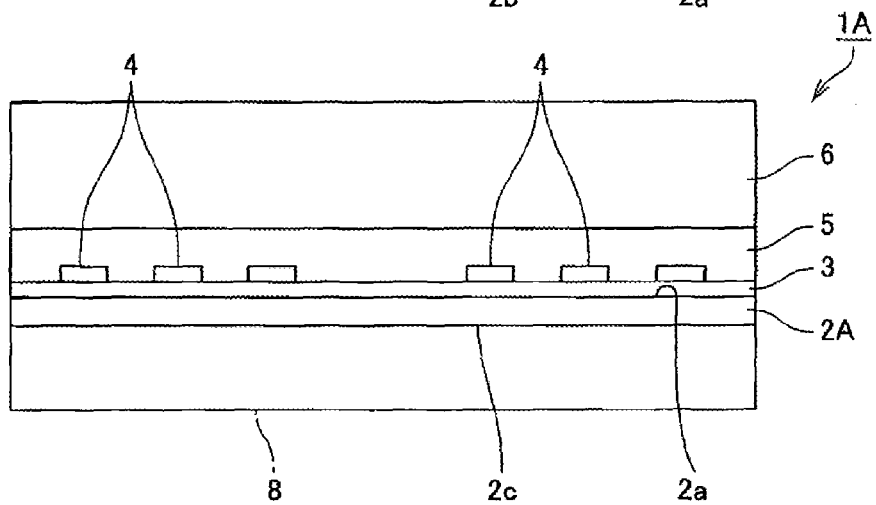
FIG. 1(b) is a schematic diagram showing of state in which the base substrate 2 shown in FIG. 1(a) is thinned.

Then, as shown in FIG. 1(b), the base substrate 2 is processed to be thinned, thereby producing a handle substrate 2A. In this way, a component 1A before irradiation is fabricated. Note that referring to FIG. 1(b), a region 8 represented by a dashed line indicates a region removed from the base substrate 2, and reference character 2c indicates an opposed surface obtained after the thinning process.

Figure 2A:
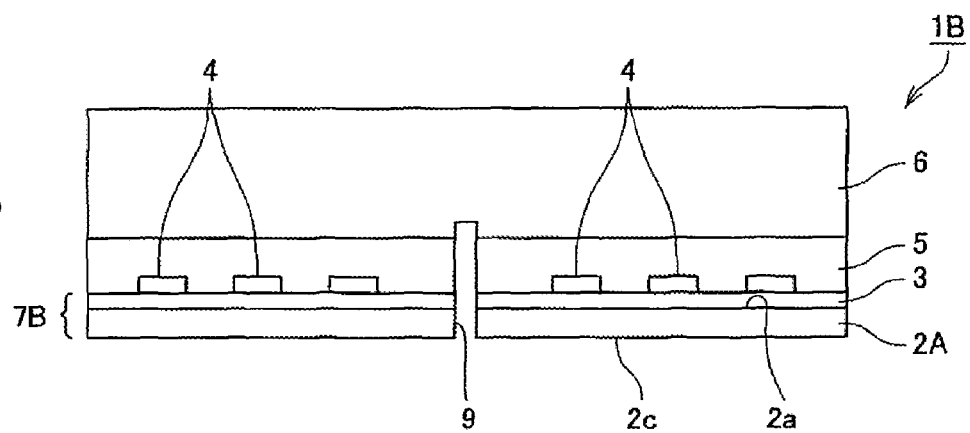
FIG. 2(a) is a schematic diagram showing state in which a dicing groove 9 is formed in the component shown in FIG. 1(b)
Figure 2B:
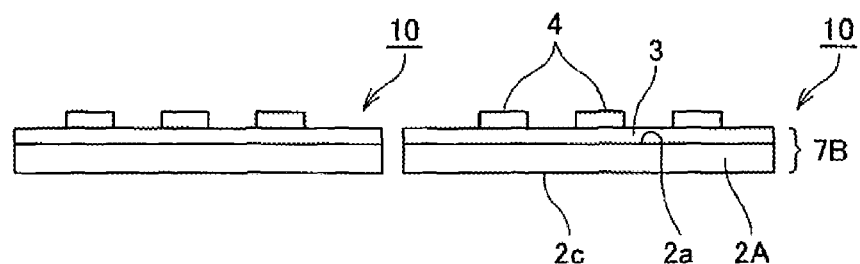
FIG. 2(b) is a schematic diagram showing a semiconductor circuit board 10 obtained after cutting.

Next, as shown in FIG. 2(a), dicing grooves 9 are formed in the component 1A to divide a large-sized composite substrate 7A into a number of composite substrates 7B. Here, the composite substrates 7B are separated along the dicing grooves 9, and preferably, the ultraviolet curable resin 5 is also divided along the dicing grooves.

Figure 3A:
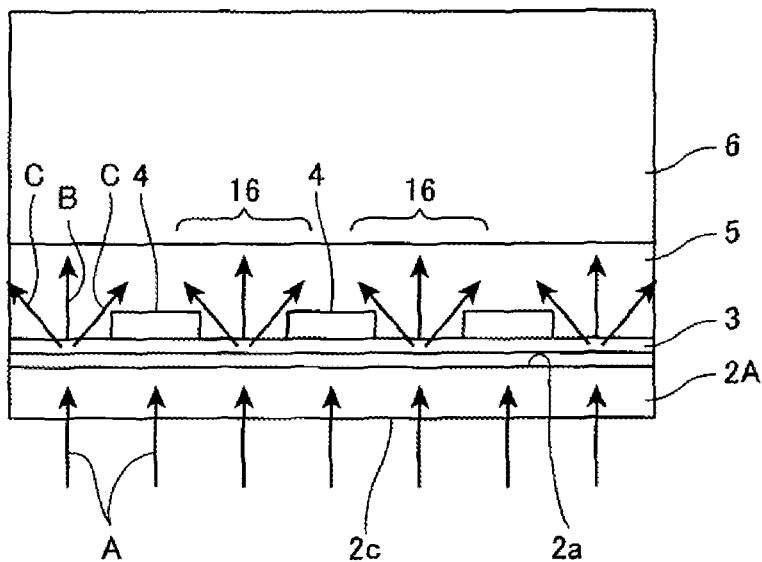
FIG. 3(a) is a schematic diagram showing state of irradiation with ultraviolet rays in the invention.

Then, as shown in FIG. 3(a), ultraviolet rays are irradiated to enter the side of the opposed surface 2c of the handle substrate 2A as indicated by arrows A. The ultraviolet rays are irradiated to the ultraviolet curable resin 5 through the handle substrate 2A and the donor substrate 3, thereby curing the resin 5.

Figure 3B:
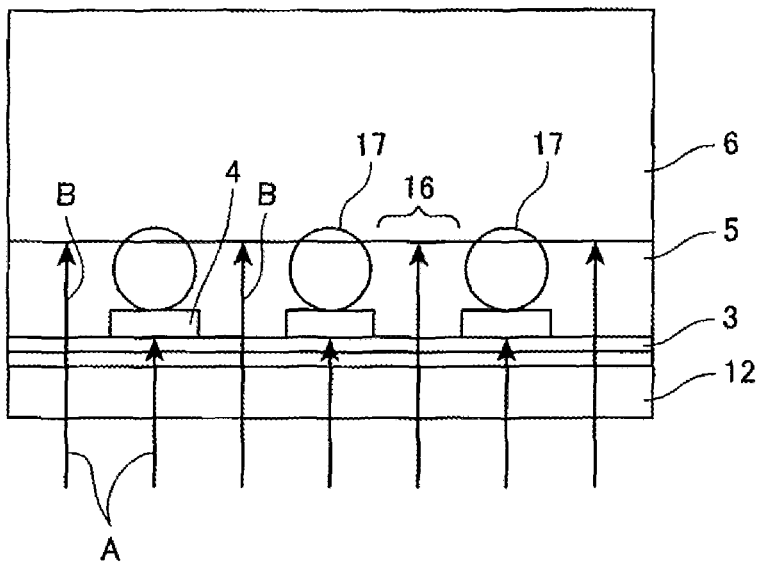
FIG. 3(b) is a schematic diagram showing state of irradiation with ultraviolet rays in a comparative example.

Here, in the related art, as shown in FIG. 3(b), the ultraviolet rays passing through a handle substrate 12 propagates straightforwardly through a gap 16 between the circuits 4 as indicated by arrows B, thereby curing the ultraviolet curable resin 5. On the other hand, the ultraviolet rays entering the circuits as indicated by arrows A cannot pass through the circuits, thus causing a shaded region 17 above each circuit. As a result, in the respective regions 17, curing of the ultraviolet curable resin does not progress and the adhesion properties are maintained. In the regions above the gaps 16, curing of the resin progresses, whereby the resin loses its adhesion properties. If the composite substrate is intended to be removed from the supporting body in this state, it is easily removed over the region above each gap 16. While in the shaded region 17, the stress caused in removing is not uniformly applied to the composite substrate, as the region 17 still maintains the adhesion properties. As a result, it is considered that cracks or failure of removal is more likely to occur in the composite substrate when removing the composite substrate from the supporting body.

On the other hand, in the invention, the translucent polycrystalline alumina forming the handle substrate is set to have an average of the total forward light transmittance of 60% or higher in a wavelength range of 200 to 400 nm. Thus, the ultraviolet rays are effectively irradiated to the resin 5 as indicated by the arrows B. At the same time, the linear light transmittance is lowered to 15% or lower, thereby scattering the ultraviolet rays within the handle substrate as indicated by arrows C. Since the donor substrate 3 is thin, the ultraviolet rays scattered in the handle substrate are effectively irradiated to regions above the circuits 4, which makes it difficult to generate the shaded regions. As a result, the resin 5 after irradiation with the ultraviolet rays is uniformly cured, which can prevent the occurrence of cracks or failure of removal in the composite substrate upon removing the composite substrate from the supporting body.

Now, composing elements of the present invention will be described further.

(Composite Substrate for Semiconductors)

A composite substrate of the invention can be used for light emitting elements for projectors, high-frequency devices, high-performance lasers, power devices, logic ICs, etc.

(Donor Substrate)

The composite substrate includes a handle substrate according to the invention and a donor substrate.

Examples of materials for the donor substrate include, but not limited thereto, preferably, one selected from the group consisting of silicon, aluminum nitride, gallium nitride, zinc oxide and diamond. The thickness of the donor substrate is not specifically limited, but is preferably in accordance with or close to the normal SEMI/JEITA specifications in terms of easiness of handling.

The donor substrate contains the above-mentioned material, and may have an oxide film on its surface. This is because ion implantation through the oxide film can exhibit the effect of suppressing channeling of the implanted ions. The oxide film preferably has a thickness of 50 to 500 nm. The donor substrate with the oxide film may be implied in the term "donor substrate" as used herein and will be referred to as the "donor substrate" unless otherwise specified.

(Handle Substrate)

The thickness of the handle substrate is not specifically limited, but is preferably in accordance with or close to the normal SEMI/JEITA specifications in terms of easiness of handling. Specifically, the thickness of the handle substrate is preferably, 525 μm for the wafer having a diameter of 100 mm; 625 μm for that of a diameter of 150 mm; 725 μm for that of a diameter of 200 mm; and 775 μm for that of a diameter of 300 mm. The handle substrate may also include a cavity.

The material of the handle substrate is the translucent polycrystalline alumina described above. The translucent polycrystalline alumina has an average of the total forward light transmittance of 60% or higher in a wavelength range of 200 to 400 nm. With this arrangement, the amount of ultraviolet rays irradiated to the ultraviolet curable resin can be increased. In this regard, the translucent polycrystalline alumina further preferably has an average of the total forward light transmittance of 65% or higher in the wavelength range of 200 to 400 nm.

Further, the translucent polycrystalline alumina forming the handle substrate has an average of the linear light transmittance of 15% or lower in the wavelength range of 200 to 400 nm. With this arrangement, the light passing through the handle substrate can be scattered to uniformly cure the ultraviolet curable resin. In this regard, the translucent polycrystalline alumina further preferably has an average of the linear light transmittance of 10% or lower in the wavelength range of 200 to 400 nm.

Figure 4:
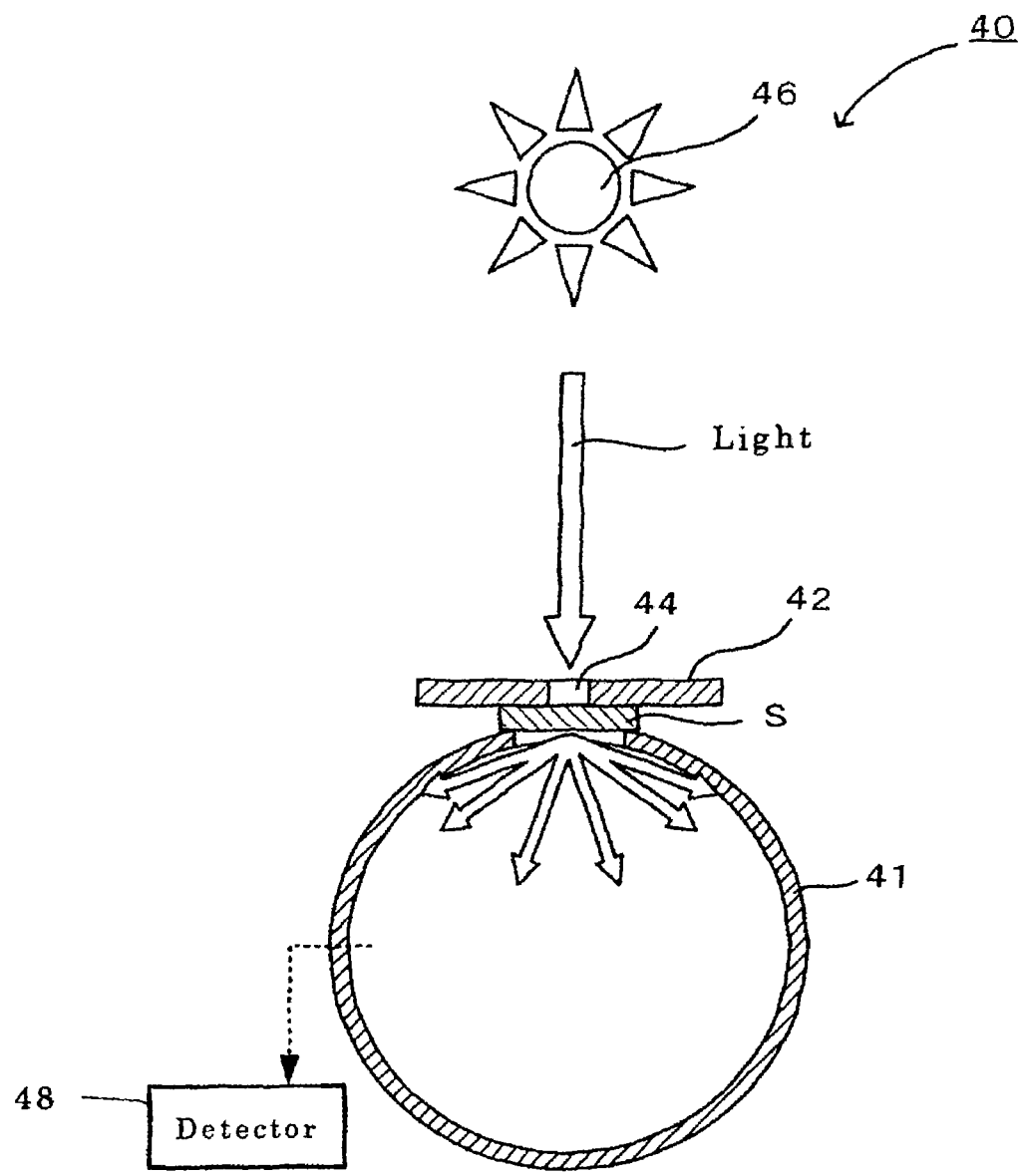
FIG. 4 is a schematic diagram for explaining a method of measuring a total forward light transmittance.

The total forward light transmittance is calculated based on a measurement value obtained by a measurement device 40 shown in FIG. 4. In the measurement device shown in FIG. 4, an opening of an integrating sphere 41 is covered with a specimen S (of 1 mm in thickness), and a plate 42 with a hole 44 (of φ3 mm in diameter) is placed on the upper surface of the specimen S. In this state, the specimen S is irradiated with light from a light source 46 through the hole 44. Then, the light passing through the specimen S is collected by use of the integrating sphere 41, thereby measuring the intensity of the light with a detector 48. The total forward light transmittance is determined by the following formula.

The total forward light transmittance=100×(measured intensity of light)/(intensity of light from light source).

The linear light transmittance is a value determined as follows.

Figure 5:
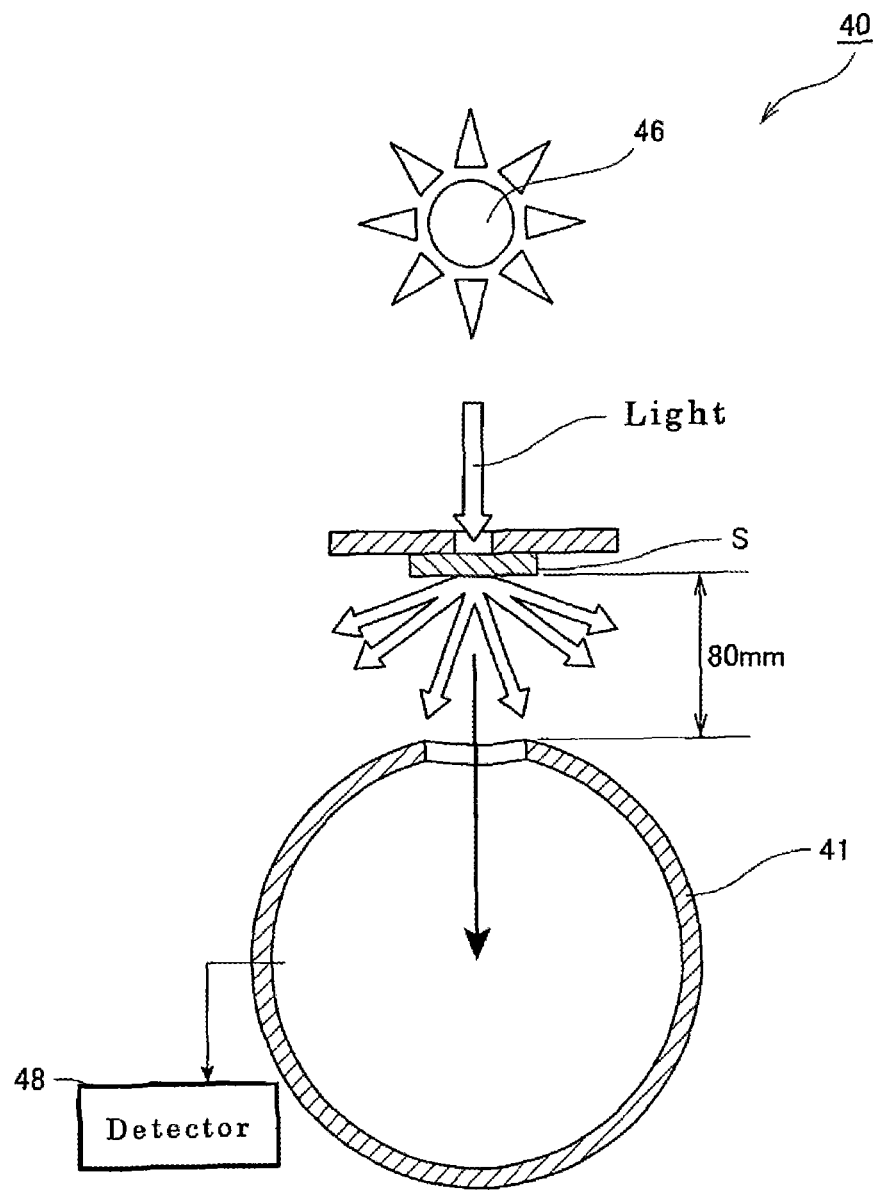
FIG. 5 is a schematic diagram for explaining a method of measuring a liner light transmittance.

Basically, the linear light transmittance is measured in the same way as the total forward light transmittance. Note that as shown in FIG. 5, a distance between the specimen S and the integrating sphere 41 is set to 80 mm, and the dimension of the opening of the integrating sphere 41 is set to φ10 mm. Only the light passing through the opening straightforwardly from the specimen S is collected to measure the light intensity.

The term "ultraviolet ray" as used in the present specification means a ray having a wavelength of 200 nm or higher and 400 nm or lower.

An alumina purity of the translucent polycrystalline alumina is 99.9% or higher.

A relative density of the translucent polycrystalline alumina is preferably set to 98% or more, and more preferably to 99% or more, in terms of durability and contamination prevention during the post-processing of the semiconductor.

An average crystal grain size of the translucent polycrystalline alumina is preferably in a range of 5 to 60 μm, thereby easily ensuring the smoothness of the bonding surface. In this regard, the average crystal grain size of the translucent polycrystalline alumina is further preferably in a range of 10 to 50 μm.

Note that the average grain size of the crystal grain is measured as follows.

(1) A section of a sintered body is subjected to mirror face polishing and then thermal etching, emphasizing grain boundaries. Then, a microscopic photograph of the section (at 100 to 200-fold magnification) is taken, and the number of grains, through which a straight line with a unit length passes, is counted. This measurement is performed at three different positions. Note that the unit length is set to a range of 500 μm to 1000 μm.
(2) The numbers of grains at the three positions are averaged.
(3) The average grain size is calculated by the following formula.

$$D=(4/\pi)\times(L/n) \qquad \text{[Calculation Formula]}$$

[D: Average grain size, L: Unit length of straight line, n: Average of the numbers of grains at three positions]

Figure 6:
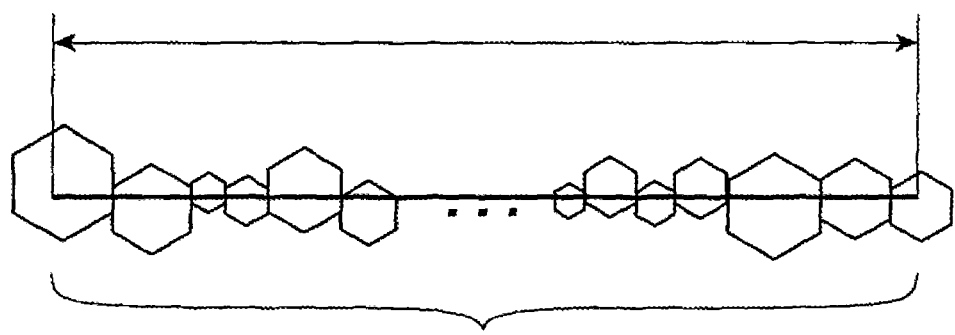
FIG. 6 is a schematic diagram for explaining a method of measuring a crystal grain size.

An example of calculation of the average grain size is shown in FIG. 6. When the numbers of grains, through which the straight line with the unit length (e.g., 500 μm) passes, at the three different positions are 22, 23, and 19, the average grain size D is determined by the above calculation formula.

$$D=(4/\pi)\cdot[500/\{(22+23+19)/3\}]=29.9 \text{ μm}.$$

A method for molding the handle substrate is not specifically limited, and may be any method including a doctor blade method, an extrusion process, a gel cast molding method, and the like. In particular, preferably, the substrate is manufactured by doctor blade method. In a preferred embodiment, a slurry containing ceramic powder, a dispersion medium and a bonding agent is molded in the form of a tape by doctor blade method. The tape is cut out into pieces, each having a predetermined shape. These pieces are laminated and pressurized into a molded body, and then the molded body is sintered.

100 ppm or more and 300 ppm or less of magnesium oxide powder is preferably added to high-purity alumina powder having a purity of 99.9% or higher (more preferably, 99.95% or higher). As such high-purity alumina powder, the high-purity alumina powder manufactured by Taimei Chemicals Co., Ltd. can be exemplified. Further, the magnesium oxide powder may preferably have a purity of 99.9% or higher and an average grain size of 0.3 μm or smaller, respectively.

An average particle size (primary particle size) of a raw material powder is not specifically limited, but preferably, 0.6 μm or less, and more preferably, 0.4 μm or less, in terms of densification in sintering at low temperature. The average particle size of the raw material powder is most preferably 0.3 μm or less. The lower limit of the average particle size is not specifically limited. The average particle size of the raw material powder can be determined by direct observation of the raw material powder using a scanning electron microscope (SEM).

Here, the average particle size means an average n=500 at (maximum long axis diameter+minimum short axis diameter)/2 of the primary particles, except for secondary agglomerated particles, on an SEM image (at a magnification of 30000 and in optional two fields of view).

The doctor blade method can be performed, for example, in the following way.
(1) Ceramic powder and a polyvinyl butyral resin (PVB resin) or acrylic resin, as a binder, are dispersed in a dispersion medium together with a plasticizing agent and a dispersion agent to prepare a slurry. The slurry is molded in the form of a tape by doctor blade method, followed by drying the dispersion medium, to thereby solidify the slurry.
(2) A plurality of tapes obtained in this way are laminated by pressing or by cold isostatic press (CIP), thereby producing a substrate-shaped molded body with a desired thickness.

To obtain the handle substrate of the invention, the sintering temperature is preferably in a range of 1700 to 1900° C., and more preferably in a range of 1750 to 1850° C. in terms of densification of the sintered body. Further, a rate of temperature elevation at a temperature of 1400 to 1600° C. is preferably set to 50 to 150° C./hr.

After producing the fully-dense sintered body in the sintering process, further an annealing treatment is additionally performed at the sintering temperature, thereby achieving production of the handle substrate. The annealing temperature is preferably within the maximum temperature in the sintering ±100° C., in which the maximum temperature is more preferably 1900° C. or lower, from the viewpoint of promoting discharge of magnesia, while preventing the deformation of the substrate and the occurrence of abnormal crystal grain growth. The annealing time period is preferably in a range of 1 to 6 hours.

Further, the annealing temperature is preferably set in a range of the maximum temperature in sintering +0 to 100° C.

In the way described above, the molding and the sintering are carried out to produce a blank substrate made of an alumina sintered body.

The blank substrate is subjected to high-precision polishing to thereby decrease a microscopic center-line average surface roughness Ra of the surface of each crystal grain. In general, such a polishing process is, for example, a chemical mechanical polishing (CMP). A polishing slurry suitable for use in this process is one obtained by dispersing abrasive grains having a grain diameter of 30 nm to 200 nm into alkali or neutral solution. Examples of materials for the abrasive grains can include silica, alumina, diamond, zirconia, and ceria. They are used either alone or in combination. Examples of the polishing pads can include a rigid urethane pad, a non-woven pad and a suede pad.

Annealing treatment is desirably performed after executing a rough polishing process and before the final high-precision polishing process. Atmosphere gases suitable for the annealing treatment can include, for example, air, hydrogen, nitrogen, argon, and vacuum. The annealing temperature is preferably in a range of 1200 to 1600° C., and the annealing time period is preferably in a range of 2 to 12 hours. Thus, the discharge of magnesia can promote without degrading the smoothness of the surface.

In a preferred embodiment, the microscopic center-line average surface roughness Ra of the surface of the handle substrate is 5 nm or less. If the surface roughness is large, the bonding strength of the donor substrate is decreased due to an intermolecular force. The center-line average surface roughness is more preferably 3 nm or less, and most preferably 1 nm or less. This is a value obtained by taking an image of an exposed surface of each crystal grain appearing at the surface of the specimen by an atomic force microscope, and by performing calculation according to JISB0601.

The atomic force microscope (AFM) is used to observe the surface morphology with a field of view of 10 μm when microscopically observing the surface roughness of each crystal grain surface.

(Bonded Form)

Techniques suitable for use in bonding of the handle substrate and the donor substrate include, but not limited to, for example, direct bonding by means of surface activation, and a substrate bonding technique using an adhesive layer.

In the direct bonding, a low-temperature bonding technique through surface activation is suitably used. After the surface activation is performed using Ar gas in vacuum of about $10^{-6}$ Pa, a monocrystalline material, such as Si, can be bonded to a polycrystalline material via an adhesive layer, such as $SiO_2$, at ambient temperature.

Examples of suitable materials for the adhesive layer can include $SiO_2$, $Al_2O_3$, and SiN, in addition to resin for the adhesion.

(Circuit)

A circuit on the donor substrate can be formed by conventional photolithography and the like. The circuit includes various electronic elements, which includes solder bumps, printed electrodes, etc., in addition to fine wires made of noble metal.

(Supporting Body)

Suitable materials for the supporting body 6 can include silicon, a glass, quarts, and various kinds of ceramics, including alumina, SiC, zirconia, aluminum nitride, and the like. In particular, silicon and a glass are preferable in terms of the easiness of planarizing, thermal expansion matching, and cost.

The supporting body may be provided with a number of through holes extending in the thickness direction. Thus, parts of the ultraviolet curable resin can enter the through holes to strength the bonding, and a removal solution can be supplied from the through holes in removal of the supporting body.

(Ultraviolet Curable Resin)

Specifically, the ultraviolet curable resin can have the composition that includes (i) an adhesive (polymeric elastomer), such as an acrylic adhesive or a saturated copolyester, (ii) an ultraviolet curable component, (iii) a photopolymerization initiator, and optionally, conventional additives, including a cross-linker, a tackifier, a plasticizer, a filler, an antioxidant, a coloring agent, etc.

Among the (i) adhesives, the acrylic adhesive that is normally used is a homopolymer of a (meth)acrylic acid ester, or a copolymer of the (meth)acrylic acid ester with a copolymeric comonomer. Suitable monomers or comonomers configuring these polymers can include, for example, alkyl esters of (meth)acrylic acid (e.g., methyl ester, ethyl ester, butyl ester, 2-ethylhexyl ester, octyl ester, etc.), hydroxyalkyl esters of (meth)acrylic acid (e.g., hydroxyethyl ester, hydroxypropyl ester), (meth)acrylic acid glycidyl ester, (meth)acrylic acid, itaconic acid, maleic anhydride, (meth)acrylic acid amides, (meth)acrylic acid N-hydroxymethyl amide, (meth)acrylic acid alkyl aminoalkyl ester (for example, dimethylaminoethyl methacrylate, t-butylaminoethyl methacrylate, etc.), vinyl acetate, styrene, acrylonitrile, and the like. The main monomer suitable for use is, usually, an acrylic acid alkyl ester in which a glass transition point of the homopolymer is −50° C. or lower.

As the saturated copolyester, saturated copolyesters of a polyhydric alcohol with 2 or more kinds of polycarboxylic acids can be exemplified. Examples of the polyhydric alcohols can include glycols, such as ethylene glycol, propylene glycol, and 1,4-butanediol. Examples of the polycarboxylic acid can include aromatic dicarboxylic acids, such as terephthalic acid and isophthalic acid; and aliphatic dicarboxylic acids, such as adipic acid and sebacic acid. As the polycarboxylic acid, a combination of the aromatic dicarboxylic acid and aliphatic dicarboxylic acid is used in many cases.

(ii) The ultraviolet curable component may be any monomer, oligomer, polymer and the like that have a carbon-carbon double bond in a molecule and are curable by radical polymerization. Examples of the ultraviolet curable component can include esters of (meth)acrylic acid with a polyhydric alcohol, such as trimethylolpropane tri(meth)acrylate, pentaerythritol tri(meth)acrylate, tetraethylene glycol di(meth)acrylate, 1,6-hexanediol di(meth)acrylate, neopentyl glycol di(meth)acrylate, and dipentaerythritol hexa(meth)acrylate; ester acrylate oligomers; cyanurate or isocyanurate compounds, such as 2-propenyl di-3-butenyl cyanurate, 2-hydroxyethyl bis(2-acryloxyethyl) isocyanurate, tris(2-acryloxyethyl) isocyanurate, and tris(2-methacryloxy ethyl) isocyanurate.

(iii) The polymerization initiator may be any substance that is cleaved by irradiation with ultraviolet rays having an appropriate wavelength, which can trigger a polymerization reaction to generate radicals. Examples of the polymerization initiator can include benzoin alkyl ethers, such as benzoin methyl ether, benzoin isopropyl ether, and benzoin isobutyl ether; aromatic ketones, such as benzyl, benzoin, benzophenone, α-hydroxycyclohexyl phenyl ketone; aromatic ketals, such as benzyl dimethyl ketal; polyvinyl benzophenone; and thioxanthones, such as chlorothioxanthone, dodecyl thioxanthone, dimethyl thioxanthone, and diethyl thioxanthone.

Suitable cross-linkers can include, for example, a polyisocyanate compound, a melamine resin, a urea resin, an epoxy resin, an acid anhydride, a polyamine, and a carboxy group containing polymer.

Further, the use of a commercially available dicing sheet, that is produced by applying such adhesive components onto a film, can perform a bonding process with ease (see, for example, Japanese Unexamined Patent Application Publication No. 2010-258341A).

EXAMPLES

Example 1

Slurry containing the mixture of the following components was prepared.

(Powdery Raw Material)

α-alumina powder having a specific surface area of 3.5 to 4.5 m$^2$/g and an average primary particle size of 0.35 to 0.45 μm 100 weight parts

| | |
|---|---|
| MgO (magnesia) | 250 ppm |
| ZrO$_2$ (zirconia) | 400 ppm |
| Y$_2$O$_3$ (yttria) (Dispersing medium) | 15 ppm |
| 2-ethylhexanol (Binder) | 45 weight parts |
| PVB resin (Dispersing agent) | 4 weight parts |
| High molecular surfactant (Plasticizer) | 3 weight parts |
| DOP | 0.1 weight part |

The slurry was molded in the form of tape by doctor blade method so that the thickness after the sintering becomes 0.25 mm. Four tape-shaped molded bodies were laminated in layers and pressed, thereby producing a substrate-shaped powder molded body so as to have a thickness of 1 mm after the sintering.

The powder molded body obtained in this way was calcined (subjected to preliminary sintering) at 1100° C. in air. Then, the substrate was placed on a plate made of molybdenum and sintered at 1750° C. by increasing the temperature from 1400° C. to 1600° C. at a rate of temperature elevation of 50° C./h, in atmosphere containing hydrogen and nitrogen mixed at 3:1, with a space of 0.1 to 0.5 mm maintained over the upper side, in order to sufficiently discharge pores from the grain boundaries. Thereafter, the sintered substrate was placed on a plate made of molybdenum and subjected to an annealing treatment at 1750° C. for three hours by placing a molybdenum weight on the substrate. The substrate obtained in this manner had an outer diameter of ϕ 4 inches, a thickness of 1 mm. An average grain size at the surface of was 20 μm, and a porosity was 0.1% or less by observation of its section. In the sintering, the space was formed over the upper side, thereby enabling discharge of the additive (mainly magnesia or the like), and the annealing treatment was performed at the substantially same temperature as that in the sintering with the weight placed on (a load applied to) the substrate, thereby allowing for acceleration of the discharge of pores.

As a result of the measurements, in the translucent alumina substrate obtained in this way, an average of the total forward light transmittance was 60%, and an average of the linear light transmittance was 15%, in a wavelength range of 200 to 400 nm. An alumina purity of the translucent polycrystalline alumina forming the handle substrate was 99.9%.

Subsequently, the substrate was polished to a thickness of 0.6 mm by using green carbon (GC) abrasive grains, diamond abrasive grains and a CMP liquid in this order, thereby producing the substrate 2.

Next, a monocrystalline Si substrate with φ 4 inches in diameter and 250 μm in thickness was prepared. Then, the monocrystalline Si substrate and the above-mentioned substrate 2 were directly bonded together by plasma activation. Both substrates used for bonding were subjected to a plasma treatment with nitrogen, and then washed with water to remove particles on their surfaces. Both these substrates have their ends pressed to be in intimate contact with each other. The pressed parts of the substrates were bonded together, whereby the bonding was transferred across their whole surfaces. This phenomenon is that the bonding between the substrates automatically progresses through a force (surface-surface attractive force) by which both the substrates are attracted to each other, which can be observed when the surface of the substrate is polished to be very smooth.

After completion of bonding both of the substrates, the monocrystalline Si substrate side was ground by a grinder to a thickness of 20 μm, and then was subjected to lapping using diamond abrasive grains having a grain size of 1 μm and a surface plate of tin until its thickness was 3 μm. Next, the substrate was polished using colloidal silica and an urethane pad to a thickness of 0.2 μm. After thinning the Si substrate, the annealing treatment was performed on the Si substrate at 300° C., thereby producing a composite substrate including the substrate 2 and the donor substrate 3.

Fine wire patterns 4 were formed by an exposure system over the donor substrate 3 of the composite substrate obtained in this way. Specifically, first, a resist was applied to the donor substrate, which was exposed using a mask on which a pattern having a wire width of 0.4 μm was formed, followed by development. For exposure, a KrF laser (λ=248 nm) was used.

Then, the monocrystalline Si substrate was bonded as the supporting body 6 to the main surface on the circuit 4 side of the semiconductor circuit board obtained in this way, via the ultraviolet curable resin. The backside 2b of the semiconductor circuit board was ground by the grinder until the thickness of the semiconductor circuit board was 120 μm. Thereafter, dicing grooves 9 were formed so as to produce the plurality of composite substrates each having a size of 1 mm×1 mm, depending on the formed circuits 4.

Next, ultraviolet rays having a central wavelength of 365 nm were applied at 300 mJ/cm² from the side of the handle substrate 2A to cure the ultraviolet curable resin 5. 100 pieces of semiconductor circuit boards 10 were removed thereby from the supporting body 6, and one piece of substrate 10 was observed to have a crack or a failure of removal.

Example 2

In the same way as Example 1, the composite substrate was fabricated. Note that as a result of the measurements, in the translucent alumina substrate obtained in this way, an average of the total forward light transmittance was 65%, and an average of the linear light transmittance was 10%, in a wavelength range of 200 to 400 nm. An alumina purity of the translucent polycrystalline alumina forming the handle substrate was 99.9%. Here, to change the total forward light transmittance and the linear light transmittance, the sintering temperature was changed to 1710° C., and the annealing temperature and time was changed to 1710° C.×12 hr.

Here, ultraviolet rays having a central wavelength of 365 nm were applied at 300 mJ/cm² from the side of the handle substrate 2A to cure the ultraviolet curable resin 5. 100 pieces of semiconductor circuit boards 10 were thereby removed from the supporting body 6, no substrate 10 with cracks and failures of removal was observed.

Comparative Example 1

In the same way as Example 1, a semiconductor circuit board and a supporting body were bonded together with an ultraviolet curable resin, and the ultraviolet curable resin was cured. 100 pieces of the semiconductor circuit boards 10 were thereby removed from the supporting body. Note that in this example, the handle substrate was made of monocrystalline sapphire, and had an average of the total forward light transmittance of 85% as well as an average of the linear light transmittance of 80%, in a wavelength range of 200 to 400 nm.

Then, ultraviolet rays having a central wavelength of 365 nm were applied at 300 mJ/cm² to cure the ultraviolet curable resin 5 from the side of the handle substrate 2A. 100 pieces of semiconductor circuit boards 10 individually cut were thereby removed from the supporting body 6, nine substrates 10 were observed to have a crack or failure of removal.

Comparative Example 2

In the same way as Example 1, a semiconductor circuit board and a supporting body were bonded together with an ultraviolet curable resin, and the ultraviolet curable resin was cured. 100 pieces of the semiconductor circuit boards 10 were thereby tried to be removed from the supporting body. Note that in this example, the handle substrate was made of alumina (having a purity of 99.5%), and had an average of the total forward light transmittance of 50% as well as an average of the linear light transmittance of 1% or less, in a wavelength range of 200 to 400 nm.

Then, ultraviolet rays having a central wavelength of 365 nm were applied at 300 mJ/cm² from the side of the handle substrate 2A to the ultraviolet curable resin 5. However, the ultraviolet curable resin 5 was not cured, and thus the respective semiconductor circuit boards 10 individually cut failed to be removed from the supporting body 6.

Comparative Example 3

In the comparative example 2, the irradiation time of the ultraviolet rays was extended. Specifically, ultraviolet rays having a central wavelength of 365 nm were applied at 900 mJ/cm² to the ultraviolet curable resin 5 from the side of the handle substrate 2A. However, the ultraviolet curable resin 5 was not cured, and thus the respective semiconductor circuit boards 10 individually cut failed to be removed from the supporting body 6. The above-mentioned results were shown in Table 1.

TABLE 1

|  | Example 1 | Example 2 | Com. Example 1 | Com. Example 2 | Comp. Example 3 |
|---|---|---|---|---|---|
| Total forward Light transmittance (%) | 60% | 65 | 85 | 50 | 50 |
| Linear transmittance (%) | 15% | 10 | 80 | <1 | <1 |
| Radiation amount (mJ/cm2) | 300 | 300 | 300 | 300 | 900 |
| Number of defects (n = 100) | 1 | 0 | 9 | 100 | 100 |

The invention claimed is:

1. A handle substrate of a composite substrate for a semiconductor, said handle substrate comprising a translucent polycrystalline alumina:
   wherein a purity of alumina of said translucent polycrystalline alumina is 99.9% or higher;
   wherein an average of a total forward light transmittance of said translucent polycrystalline alumina is 60% or higher in a wavelength range of 200 to 400 nm, and
   wherein an average of a linear light transmittance of said translucent polycrystalline alumina is 15% or lower in a wavelength range of 200 to 400 nm.

2. A composite substrate for a semiconductor, said composite substrate comprising:
   said handle substrate of claim 1; and
   a donor substrate bonded to a bonding surface of said handle substrate.

3. The composite substrate of claim 2, wherein said donor substrate comprises monocrystalline silicon.

4. A semiconductor circuit board, comprising:
   said composite substrate for a semiconductor of claim 2; and
   a circuit provided on said donor substrate.

5. A method of manufacturing a semiconductor circuit board, said semiconductor circuit board comprising a handle substrate, a donor substrate bonded to a bonding surface of said handle substrate and a circuit provided on said donor substrate, the method comprising the steps of:
   preparing a component, said component comprising a base substrate comprising a translucent polycrystalline alumina and having a bonding surface and an opposed surface, a donor substrate bonded to a bonding surface of said base substrate, and a circuit provided on said donor substrate, wherein a purity of alumina of said translucent polycrystalline alumina is 99.9% or higher, an average of a total forward light transmittance of said translucent polycrystalline alumina is 60% or higher in a wavelength range of 200 to 400 nm, and an average of a linear light transmittance of said translucent polycrystalline alumina is 15% or lower in a wavelength range of 200 to 400 nm;
   forming said handle substrate by processing said base substrate from a side of said opposed surface to thereby decrease a thickness of said base substrate; and
   irradiating ultraviolet rays in a wavelength range of 200 to 400 nm to a ultraviolet curable resin from a side of said handle substrate, thereby curing said ultraviolet curable resin, while said ultraviolet curable resin is placed to intervene between said donor substrate and a supporting body.

6. The method of claim 5, further comprising the step of:
   removing said supporting body from said semiconductor circuit board, after curing said ultraviolet curable resin.

7. The method of claim 5, wherein said donor substrate comprises monocrystalline silicon.

* * * * *